United States Patent
Liang et al.

(10) Patent No.: US 8,933,504 B2
(45) Date of Patent: Jan. 13, 2015

(54) SEMICONDUCTOR STRUCTURE AND METHOD FOR FORMING THE SEMICONDUCTOR STRUCTURE

(76) Inventors: Qingqing Liang, Lagrangeville, NY (US); Huicai Zhong, San Jose, CA (US); Huilong Zhu, Poughkeepsie, NY (US)

( * ) Notice: Subject to any disclaimer, the term of this patent is extended or adjusted under 35 U.S.C. 154(b) by 7 days.

(21) Appl. No.: 13/807,010

(22) PCT Filed: Nov. 30, 2011

(86) PCT No.: PCT/CN2011/001997
§ 371 (c)(1),
(2), (4) Date: Dec. 27, 2012

(87) PCT Pub. No.: WO2013/056405
PCT Pub. Date: Apr. 25, 2013

(65) Prior Publication Data
US 2013/0140624 A1  Jun. 6, 2013

(30) Foreign Application Priority Data
Oct. 17, 2011  (CN) .......................... 2011 1 0314174

(51) Int. Cl.
*H01L 29/78* (2006.01)
*H01L 21/265* (2006.01)
(Continued)

(52) U.S. Cl.
CPC ....... *H01L 29/7827* (2013.01); *H01L 27/11556* (2013.01); *H01L 21/28008* (2013.01); *H01L 27/115* (2013.01); *H01L 29/66666* (2013.01); *H01L 29/458* (2013.01); *H01L 29/4908* (2013.01); *H01L 29/78642* (2013.01); *H01L 21/8221* (2013.01); *H01L 21/84* (2013.01);
(Continued)

(58) Field of Classification Search
CPC .............. H01L 21/84; H01L 21/28008; H01L 27/0688; H01L 27/1203; H01L 27/115; H01L 27/11556; H01L 29/7827; H01L 29/66666
USPC ............ 257/296, 314, 324, 329, 337, E21.41, 257/E21.401, E21.693, E27.091, E29.262; 438/192, 257, 268, 270
See application file for complete search history.

(56) References Cited

U.S. PATENT DOCUMENTS

| | | |
|---|---|---|
| 5,324,673 A | 6/1994 | Fitch |
| 5,599,724 A * | 2/1997 | Yoshida ........................ 438/192 |
| 2009/0101969 A1* | 4/2009 | Katsumata et al. ........... 257/329 |

*Primary Examiner* — Dao H Nguyen
(74) *Attorney, Agent, or Firm* — Treasure IP Group (57) ABSTRACT

The invention discloses a semiconductor structure comprising: a substrate, a conductor layer, and a dielectric layer surrounding the conductor layer on the substrate; a first insulating layer covering both of the conductor layer and the dielectric layer; a gate conductor layer formed on the first insulating layer, and a dielectric layer surrounding the gate conductor layer; and a second insulating layer covering both of the gate conductor layer and the dielectric layer surrounding the gate conductor layer; wherein a through hole filled with a semiconductor material penetrates through the gate conductor layer perpendicularly, the bottom of the through hole stops on the conductor layer, and a first conductor plug serving as a drain/source electrode is provided on the top of the through hole; and a second conductor plug serving as a source/drain electrode electrically contacts the conductor layer, and a third conductor plug serving as a gate electrode electrically contacts the gate conductor layer.

11 Claims, 13 Drawing Sheets

(51) Int. Cl.
*H01L 29/66* (2006.01)
*H01L 29/45* (2006.01)
*H01L 29/49* (2006.01)
*H01L 29/786* (2006.01)
*H01L 21/822* (2006.01)
*H01L 21/84* (2006.01)
*H01L 27/06* (2006.01)
*H01L 27/12* (2006.01)
*H01L 27/115* (2006.01)
*H01L 21/28* (2006.01)

(52) U.S. Cl.
CPC ........ *H01L 27/0688* (2013.01); *H01L 27/1203* (2013.01)
USPC ........... 257/329; 257/296; 257/314; 257/324; 257/337; 257/E21.41; 257/E21.401; 257/E21.693; 257/E27.091; 257/E27.103; 257/E29.262; 438/192; 438/257; 438/268; 438/270

SEMICONDUCTOR STRUCTURE AND METHOD FOR FORMING THE SEMICONDUCTOR STRUCTURE

This application is a National Phase application of, and claims priority to, PCT Application No. PCT/CN2011/001997, filed on Nov. 30, 2011, entitled "semiconductor structure and method for forming semiconductor structure", which claimed priority to Chinese Application No. 201110314174.1, filed on Oct. 17, 2011. Both the PCT Application and Chinese Application are incorporated herein by reference in their entireties.

FIELD OF THE INVENTION

The invention relates to a semiconductor structure. More specifically, the invention relates to a semiconductor structure having field effect transistors. The invention also relates to methods for forming such a semiconductor structure and a stack structure thereof.

BACKGROUND OF THE INVENTION

Vertical field effect transistor (vertical FET) is a new solution of integration in current semiconductor integrated circuit. The vertical FET is a device in which the source-drain current flows within the through hole perpendicular to the surface of the substrate. If the surface of the substrate is horizontal, the vertical FET is usually an upright through hole, of which the top and the bottom are source/drain electrode or drain/source electrode. A major advantage of the vertical FET is that the length of the through hole is not defined by photolithography, but is defined by, e.g. epitaxy or lamination, which can provide good thickness control even in nanometer scale. Another advantage is that the vertical FET is intrinsically suitable for designing asymmetric devices.

However, with regard to vertical FET devices, challenges exist for reducing parasitic resistance, and obtaining vertical FETs with different gate lengths and better isolation in a single structure.

Thus, there is a need for a technical solution to reduce the parasitic resistance of semiconductor devices of vertical FETs, provide vertical FETs with different gate lengths and better isolation in a single semiconductor structure.

SUMMARY OF THE INVENTION

One of the objects of the invention is to provide an improved semiconductor structure and the method for forming it.

According to a first aspect of the invention, there is provided a semiconductor structure comprising:
a substrate, a conductor layer, and a dielectric layer surrounding the conductor layer on the substrate;
a first insulating layer covering both of the conductor layer and the dielectric layer;
a gate conductor layer formed on the first insulating layer, and a dielectric layer surrounding the gate conductor layer; and
a second insulating layer covering both of the gate conductor layer and the dielectric layer surrounding the gate conductor layer;
wherein a through hole filled with a semiconductor material penetrates through the gate conductor layer perpendicularly, the bottom of the through hole stops on the conductor layer, and a first conductor plug serving as a drain/source electrode is provided on the top of the through hole; and
a second conductor plug serving as a source/drain electrode electrically contacts the conductor layer, and a third conductor plug serving as a gate electrode electrically contacts the gate conductor layer.

According to a second aspect of the invention, there is provided a method for forming a semiconductor structure comprising:
a. forming a conductor layer and a dielectric layer surrounding the conductor layer on a substrate;
b. forming a first insulating layer covering both of the conductor layer and the dielectric layer, and forming a gate conductor layer with a dielectric layer surrounding the gate conductor layer on the first insulating layer;
c. forming a second insulating layer covering both of the gate conductor layer and the dielectric layer surrounding the gate conductor layer;
d. etching a through hole with a side wall layer, wherein the through hole penetrates through the gate conductor layer perpendicularly, and the bottom of the through hole stops on the conductor layer;
e. depositing a semiconductor material into the through hole; and
f. providing a first conductor plug serving as a drain/source electrode on the top of the through hole, providing a second conductor plug serving as a source/drain electrode to electrically contact the conductor layer, and providing a third conductor plug serving as a gate electrode to electrically contact the gate conductor layer.

According to a third aspect of the invention, there is provided a stacked semiconductor structure, wherein the stacked semiconductor structure comprises at least two stacked layers of the semiconductor structures according to the first aspect of the invention, the second conductor plug serving as a source/drain electrode and provided on the top of the through hole in the lower semiconductor structure electrically contacts the conductor layer of the upper semiconductor structure in two neighboring layers of the semiconductor structures, and other conductor plugs extend upward to the top of the stacked semiconductor structure in mutually different positions.

According to a fourth aspect of the invention, there is provided a method for forming a stacked semiconductor structure, which comprises: after performing the steps of forming the semiconductor structure according to the first aspect of the invention, forming a substrate layer on the top of the formed semiconductor structure, and performing the steps of forming the semiconductor structure according to the first aspect of the invention on the substrate layer again to stack multiple layers of the semiconductor structures; in two neighboring layers of the semiconductor structures, the conductor plug serving as a source/drain electrode and provided on the top of the through hole in the lower semiconductor structure electrically contacts the conductor layer of the upper semiconductor structure; and other conductor plugs extend upward to the top of the stacked semiconductor structure in mutually different positions.

BRIEF DESCRIPTION OF THE DRAWINGS

These and other objects, features and advantages of the invention will become more apparent from the following detailed description of the exemplary embodiments of the invention with reference to the accompanying drawings. In the drawings.

DETAILED DESCRIPTION OF THE INVENTION

Exemplary embodiments of the invention will be described in detail with reference to the accompanying drawings hereinafter. The drawings are schematic and not drawn to scale. The drawings only illustrate embodiments of the invention, and are not intended to limit the protective scope of the invention. In the drawings, like reference numerals denote identical or similar components. For making the technical solution of the invention clearer, process steps and device structures known in the art are omitted herein.

First, a semiconductor structure according to an exemplary embodiment of the invention will be described in detail with reference to FIG. 1 and FIG. 2.

Figure 1:
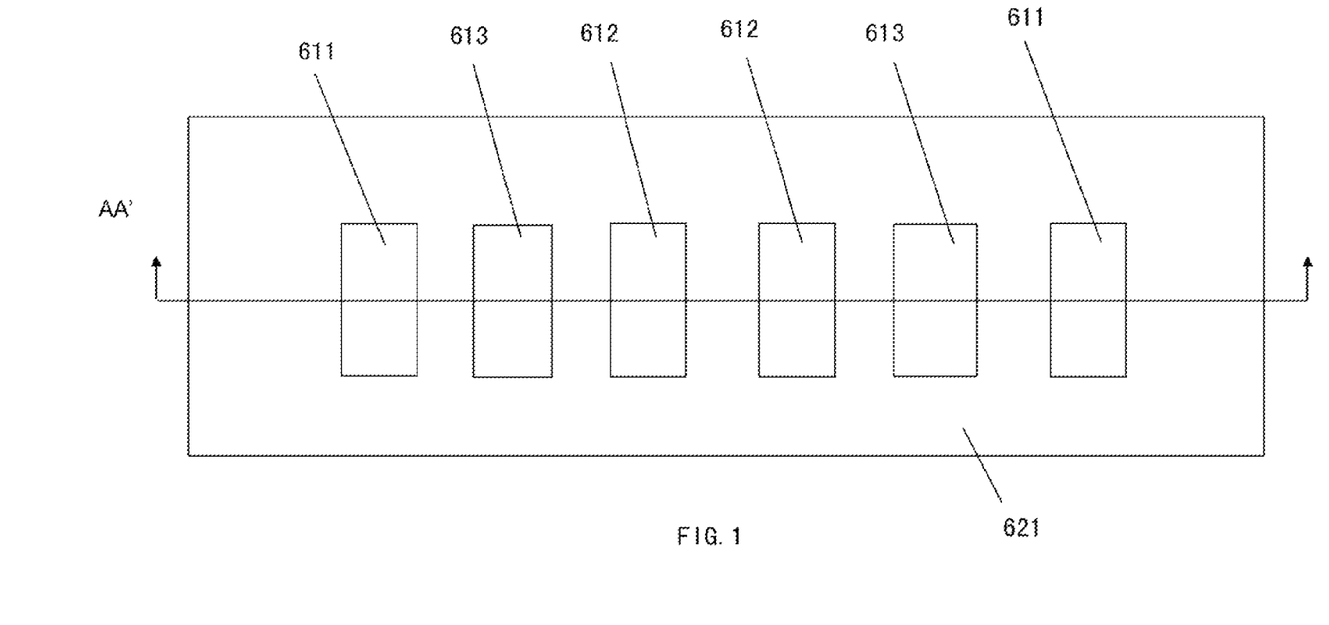
FIG. 1 shows a top view of a semiconductor structure according to an exemplary embodiment of the invention.
Figure 2:
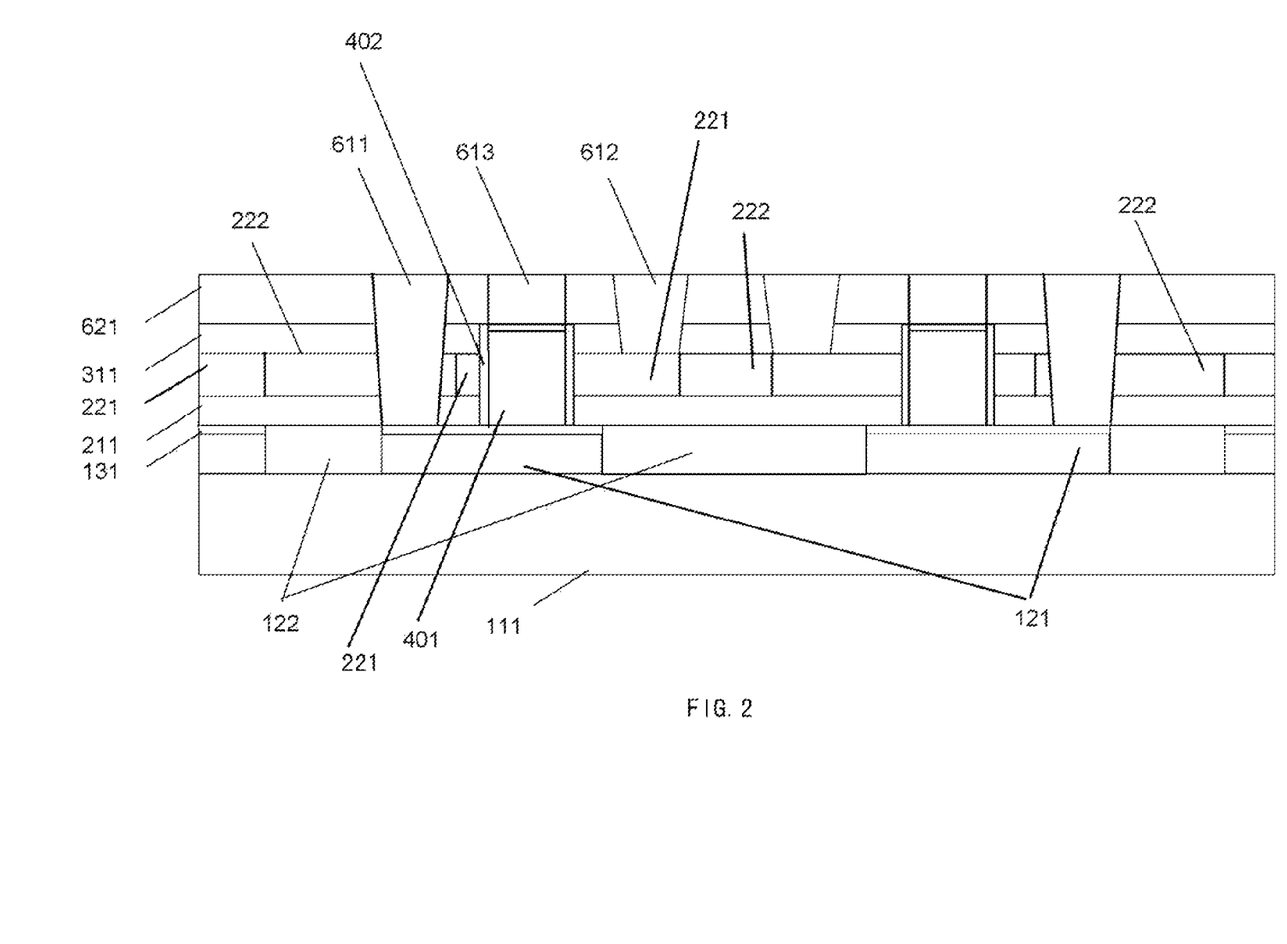
FIG. 2 shows a cross-section view of the semiconductor structure of FIG. 1 along line AA'.

FIG. 1 shows a top view of the semiconductor structure according to an exemplary embodiment of the invention, and FIG. 2 shows a cross-section view of the semiconductor structure of FIG. 1 along line AA'. The semiconductor structure according to an exemplary embodiment of the invention has zygomorphy (while it is also possible to form several repetitive structures which are arranged sequentially from left to right), and therefore the unilateral structure will be introduced emphatically hereinafter.

As shown in FIG. 2, the semiconductor structure according to an exemplary embodiment of the invention comprises: a substrate 111; a conductor layer 121 and a dielectric layer 122 surrounding the conductor layer 121 on the substrate, wherein the conductor layer 121 may preferably be a metal layer (not shown), and the conductor layer 121 may also comprise a metal layer and a metal silicide layer 131 formed on the metal layer to obtain good electrical contact; an insulating layer 211 covering the conductor layer 121 and the dielectric layer 122; a gate conductor layer 221 formed on the insulating layer 211, and a dielectric layer 222 surrounding the gate conductor layer 221; an insulating layer 311 covering the gate conductor layer 221 and the dielectric layer 222 surrounding the gate conductor layer 221; and a conductor plug 611 serving as source/drain electrode electrically contacts the conductor layer 121, and a conductor plug 612 serving as gate electrode electrically contacts the gate conductor layer 221, wherein a through hole 401 filled with a semiconductor material 511 penetrates through the gate conductor layer 221 perpendicularly, the bottom of the through hole stops on the conductor layer 121, and a conductor plug 613 serving as drain/source electrode is provided on the top of the through hole. As an example, the substrate 111 extending in the horizontal direction may be formed of insulating material. For example, the substrate 111 may comprise silicon dioxide, silicon nitride, or a combination of silicon dioxide and silicon nitride. The substrate layer 111 may be formed of stacked multi-layer materials. In one embodiment, an insulating layer 621, of which the thickness may be adjusted according to different heights of the conductor plugs 611, 612 and 613, can be formed among the conductor plugs.

As shown in FIG. 2, two field effect transistors may be separated from each other by the insulating layers 211, 311, 621 and the dielectric layers 122, 222, and the extending of respective insulating layers and dielectric layers in the horizontal direction can effectively ensure the isolation between these two field effect transistors. Preferably, the conductor layer 121 and the gate conductor layer 221 are formed of metals, which can be selected from, but not limited to, a group consisting of tungsten, germanium, nickel, titanium or cobalt, etc. The dielectric layer 122 surrounding the conductor layer 121 and the dielectric layer 222 surrounding the gate conductor layer 221 may be formed of insulating materials. The insulating layers 211, 311, 621 may be formed of silicon dioxide or other common insulating materials. The conductor plugs 611, 612 and 613 may preferably be formed of metals suitable for deposition process, such as tungsten, germanium, nickel, titanium or cobalt, etc. In one embodiment, the side wall layer 402 of the through hole 401 is made of high-k materials (such as $HfO_2$, $Si_3N_4$, $Al_2O_3$, $TiO_2$, ZnO or $CeO_2$, etc.) by epitaxy process, and then the semiconductor material 511 is deposited into the through hole 401 to prevent the leakage of electricity between the gate conductor layer 221 and the semiconductor material 511 filled in the through hole 401. The gate electrode is firstly formed within the semiconductor structure by etching, epitaxy and deposition process, and thus the edge roughness of the through hole 401 can be controlled better in the direction of gate electrode (i.e. the direction of thickness of the gate conductor layer 221), compared with the conventional formation of the gate electrode by photolithography. As an example, the semiconductor material 511 filled in the through hole 401 is P-type polysilicon or N-type polysilicon, and therefore (both of) these two field effect transistors shown in the figures may be P-type field effect transistor(s) or N-type field effect transistor(s). As an example, a metal silicide layer may be formed on the top of the through hole 401 to form good contact with the source/drain electrode material.

The semiconductor structure illustrated in FIG. 1 and FIG. 2 has been described in detail hereinbefore. With etching, epitaxy, deposition processes and combinations thereof, the field effect transistors illustrated in FIG. 1 and FIG. 2 may be obtained. In practice, with the same processing steps, a larger substrate layer in the horizontal direction may be selected, and more field effect transistors may be achieved according to requirements of production.

To reduce the size of the devices and obtain different gate lengths, there is proposed a stacked semiconductor structure formed by the Damascene Process with the above semiconductor structure as a basic structure.

Figure 13:
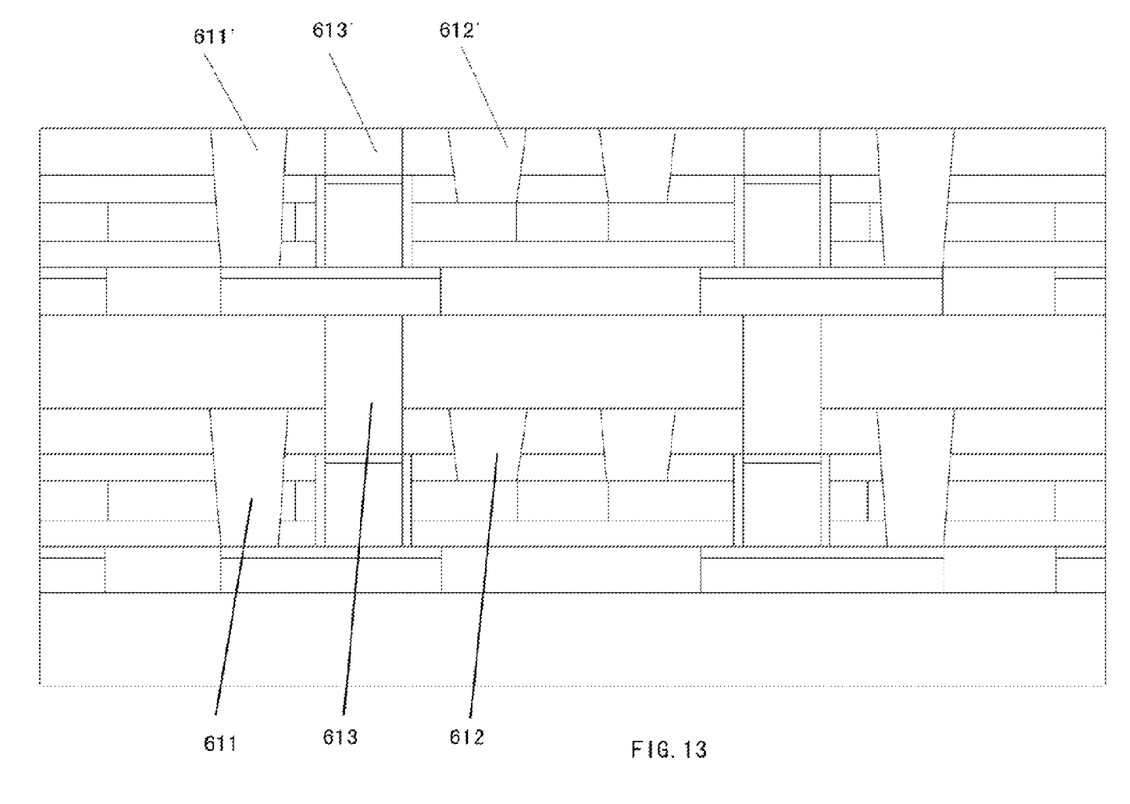
FIG. 13 shows the cross-section view of the stacked semiconductor structure according to an exemplary embodiment of the invention.

In the exemplary embodiment illustrated in FIG. 13, there are at least two layers of stacked semiconductor structures, in which the conductor plug 613 provided on the top of the through hole 401 in the lower semiconductor structure electrically contacts the conductor layer 121' of the upper semiconductor structure, and other conductor plugs extend upward to the top of the stacked semiconductor structure in mutually different positions. In the stacked semiconductor structure illustrated in FIG. 13, to obtain a vertical field effect transistor with a single gate length, the conductor plugs 611', 612', 613' can be used as the source electrode, the gate electrode and the drain electrode of the FET devices, respectively (in which the source electrode and the drain electrode can be interchanged, and the through hole 401' can be used as the path for current flowing of the FET devices), and the conductor plugs 611, 612, 611' can be used as the source electrode, the gate electrode and the drain electrode of the FET devices, respectively (in which the source electrode and the drain electrode can be interchanged, and the through hole 401 can be used as the path for current flowing of the FET devices; and the conductor plugs 611, 612 and 611', 612' extend upward to the top of the stacked semiconductor structure respectively in mutually different positions in the direction perpendicular to the paper sheet to form 4 individual contacts). To obtain a vertical field effect transistor formed by interconnecting two transistors which may have two different gate lengths, the conductor plugs 611, (612 and 612'), and 613' can be used as the source electrode, the gate electrodes and the drain electrode of the FET devices, respectively (in which the source electrode and the drain electrode can be interchanged, the through holes 401 and 401' can be used together as the path for current flowing of the FET devices, the conductor plugs 611, 612 and 611', 612' extend upward to the top of the stacked semiconductor structure respectively in mutually different positions in the direction perpendicular to the paper sheet to form 4 individual contacts, and the conductor plugs 612, 612' are equipotentially connected).

To obtain a vertical field effect transistor formed by interconnecting two transistors, which may have two different gate lengths, alternations based on the structure shown in FIG. 13 may be achieved. For example, in the case of other structures remain unchanged, the conductor plug 612' may not be provided, and the conductor plug 612 extends upward to the top of the stacked semiconductor structure (i.e. to be in contact with the lower gate conductor layer 221 and the upper gate conductor layer 221') to serve as a gate electrode. Similarly, to obtain two vertical field effect transistors arranged in parallel configuration, respective source/drain/gate electrodes of upper and lower vertical field effect transistors may be equipotentially connected by the structure as shown on the right side of FIG. 13 so as to realize parallel operation. Based on the above principle, field effect transistors with various different gate lengths may be obtained by combinations of above connections.

Hereinafter, the method for forming the semiconductor structure and the stacked semiconductor structure by the Damascene Process according to an exemplary embodiment of the invention is described in detail with reference to FIG. 3 to FIG. 12.

Figure 3:
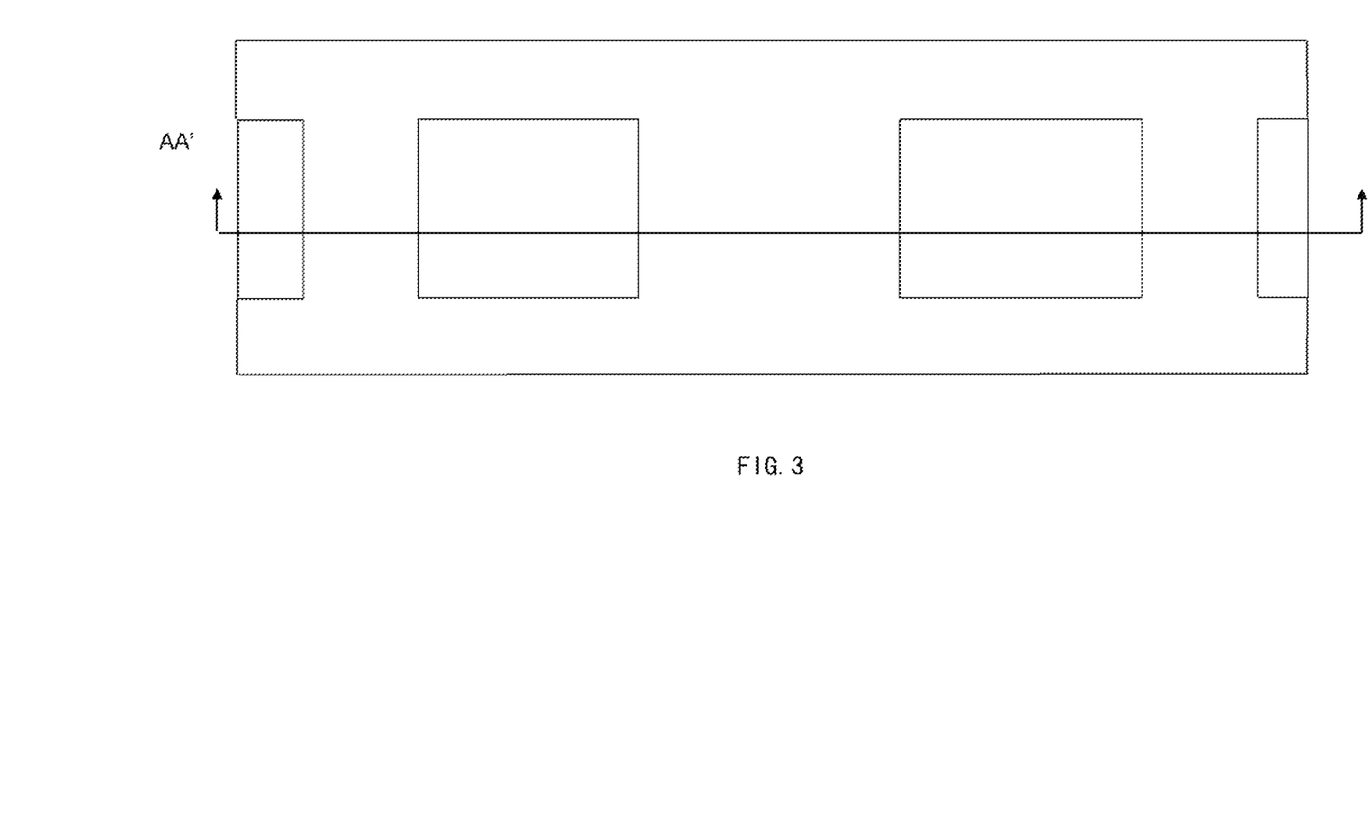
FIG. 3 shows a top view of the first step of the method for forming the semiconductor structure according to an exemplary embodiment of the invention.
Figure 4:
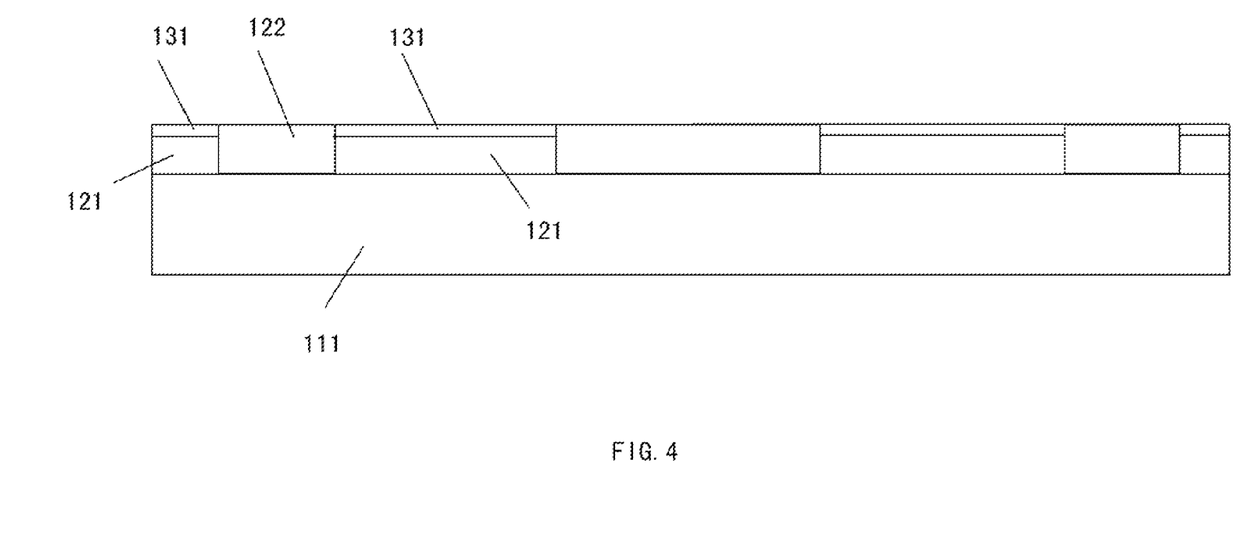
FIG. 4 shows a cross-section view of the semiconductor structure of FIG. 3 along the line AA'.

FIG. 3 and FIG. 4 show the first step of the method for forming the semiconductor structure according to an exemplary embodiment of the invention. A conductor layer 121 and a dielectric layer 122 surrounding the conductor layer 121 are formed on a substrate 111, and the conductor layer 121 may also comprise a metal silicide layer 131. In this step, the conductor layer 121 may be firstly deposited and then patterned, dielectrics may be filled into the etched parts to form the dielectric layer 122 surrounding the conductor layer 121, and then a chemical mechanical polishing may be performed. It is also possible that the dielectric layer 122 may be firstly deposited and patterned, conductive materials may be filled into the etched parts to form the conductor layer 121 surrounded by the dielectric layer 122, and then a chemical mechanical polishing may be performed.

Figure 5:
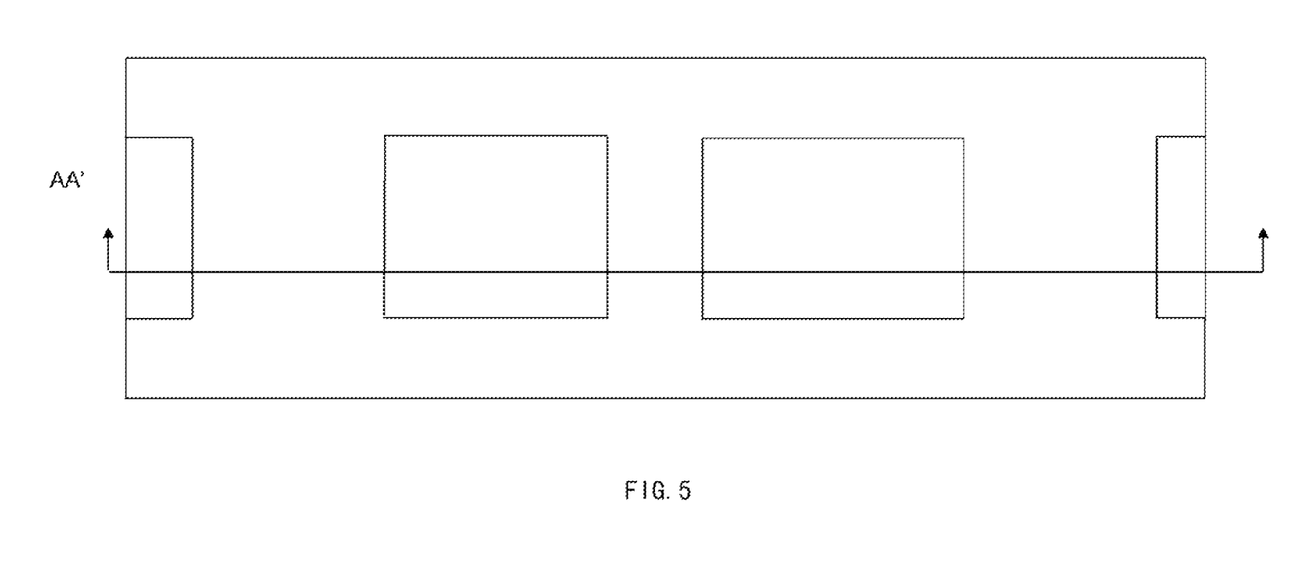
FIG. 5 shows a top view of the second step of the method for forming the semiconductor structure according to an exemplary embodiment of the invention.
Figure 6:
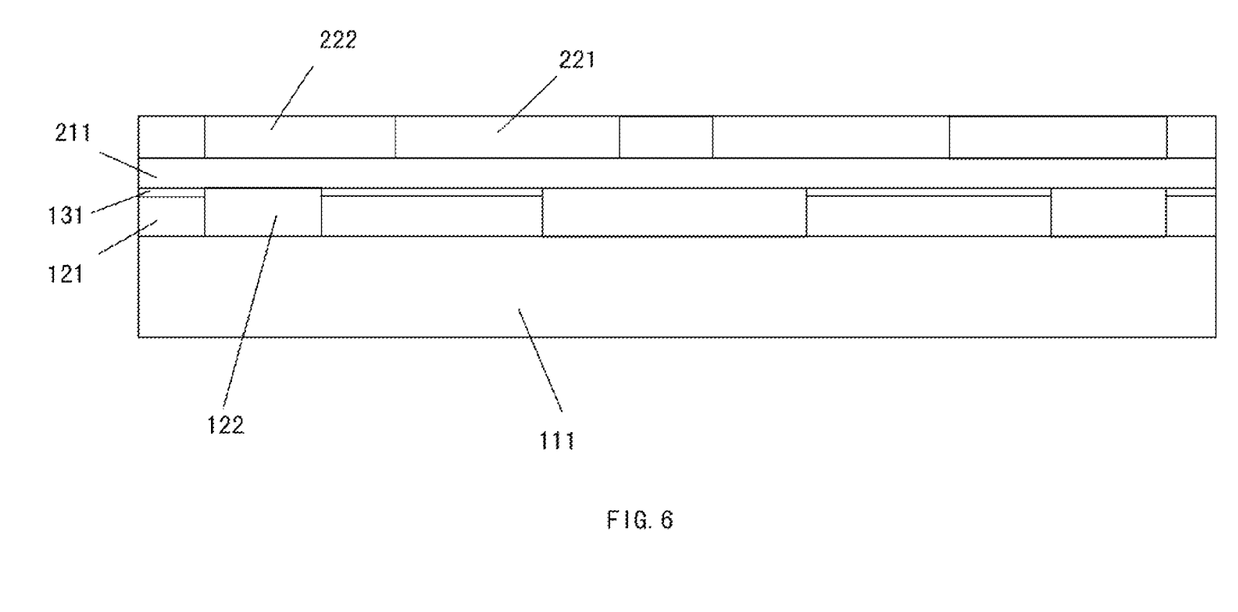
FIG. 6 shows a cross-section view of the semiconductor structure of FIG. 5 along line AA'.

FIG. 5 and FIG. 6 show the second step of the method for forming the semiconductor structure according to an exemplary embodiment of the invention. An insulating layer 211 is formed to cover the conductor layer 121 and the dielectric layer 122, and a gate conductor layer 221 and a dielectric layer 222 surrounding the gate conductor layer 221 are formed on the insulating layer 211.

Figure 7:
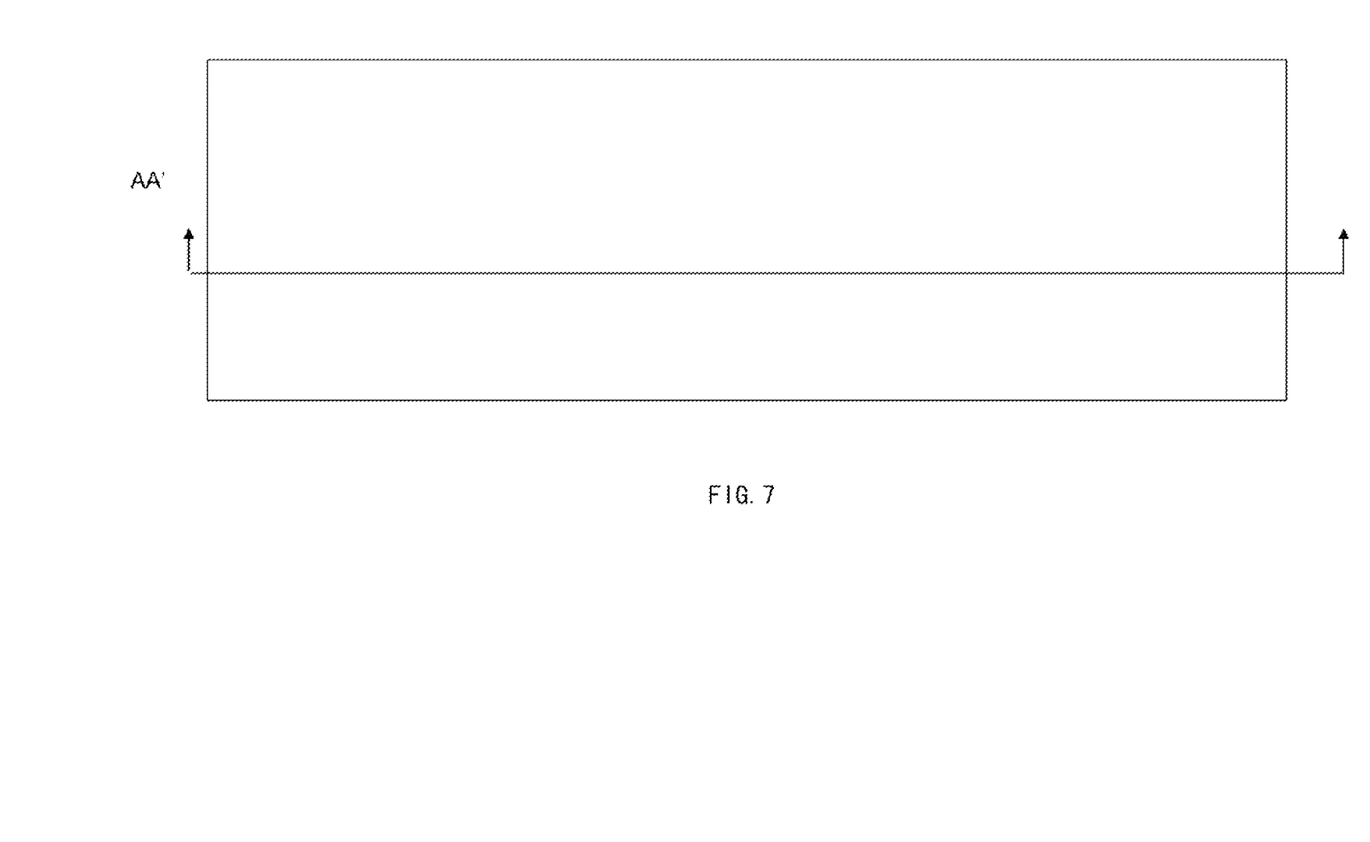
FIG. 7 shows a top view of the third step of the method for forming the semiconductor structure according to an exemplary embodiment of the invention.
Figure 8:
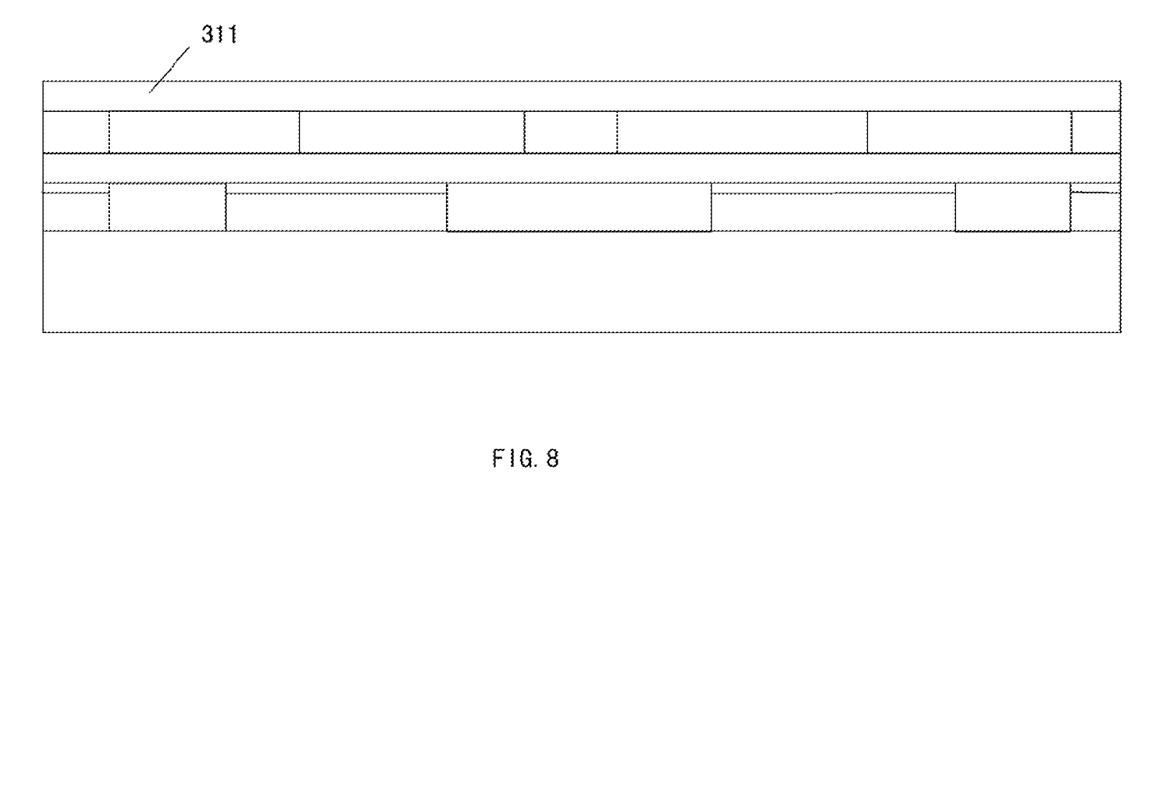
FIG. 8 shows a cross-section view of the semiconductor structure of FIG. 7 along line AA'.

FIG. 7 and FIG. 8 show the third step of the method for forming the semiconductor structure according to an exemplary embodiment of the invention. An insulating layer 311 is formed to cover the gate conductor layer 221 and the dielectric layer 222 surrounding the gate conductor layer 221.

Figure 9:
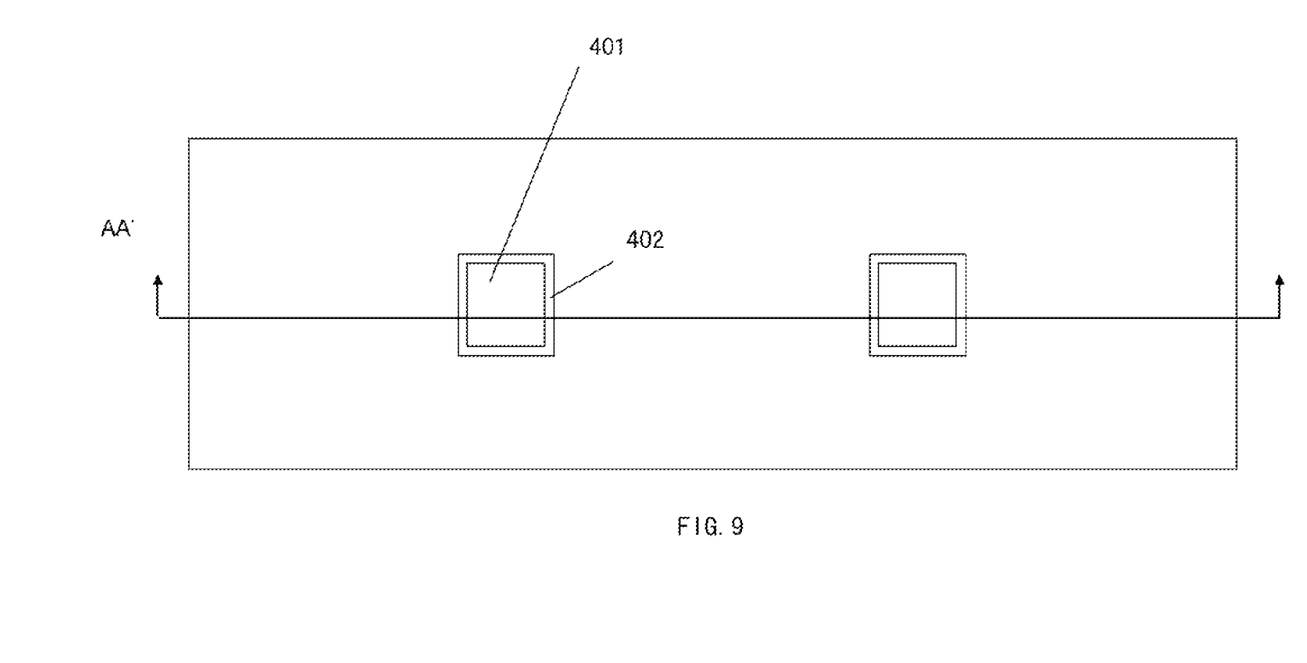
FIG. 9 shows a top view of the fourth step of the method for forming the semiconductor structure according to an exemplary embodiment of the invention.
Figure 10:
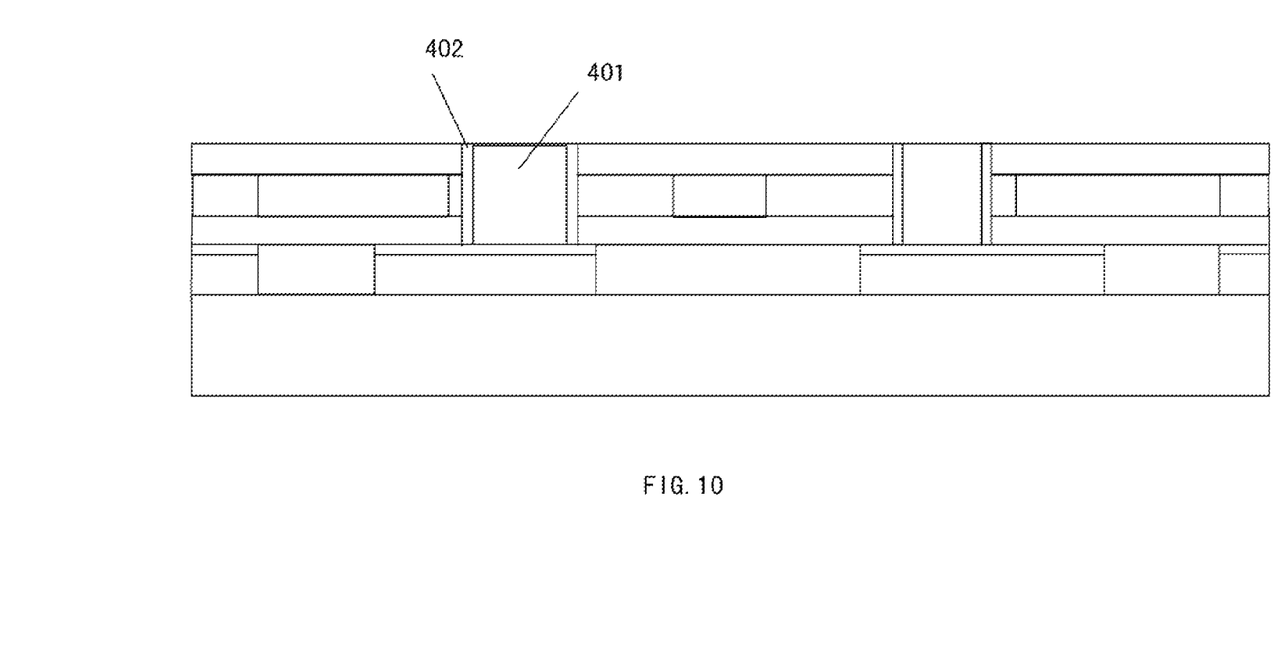
FIG. 10 shows a cross-section view of the semiconductor structure of FIG. 9 along line AA'.

FIG. 9 and FIG. 10 show the fourth step of the method for forming the semiconductor structure according to an exemplary embodiment of the invention. A through hole 401 is etched to penetrate through the gate conductor layer 221 perpendicularly, the bottom of the through hole 401 stops on the conductor layer 121, and the through hole 401 has a side wall layer 402.

Figure 11:
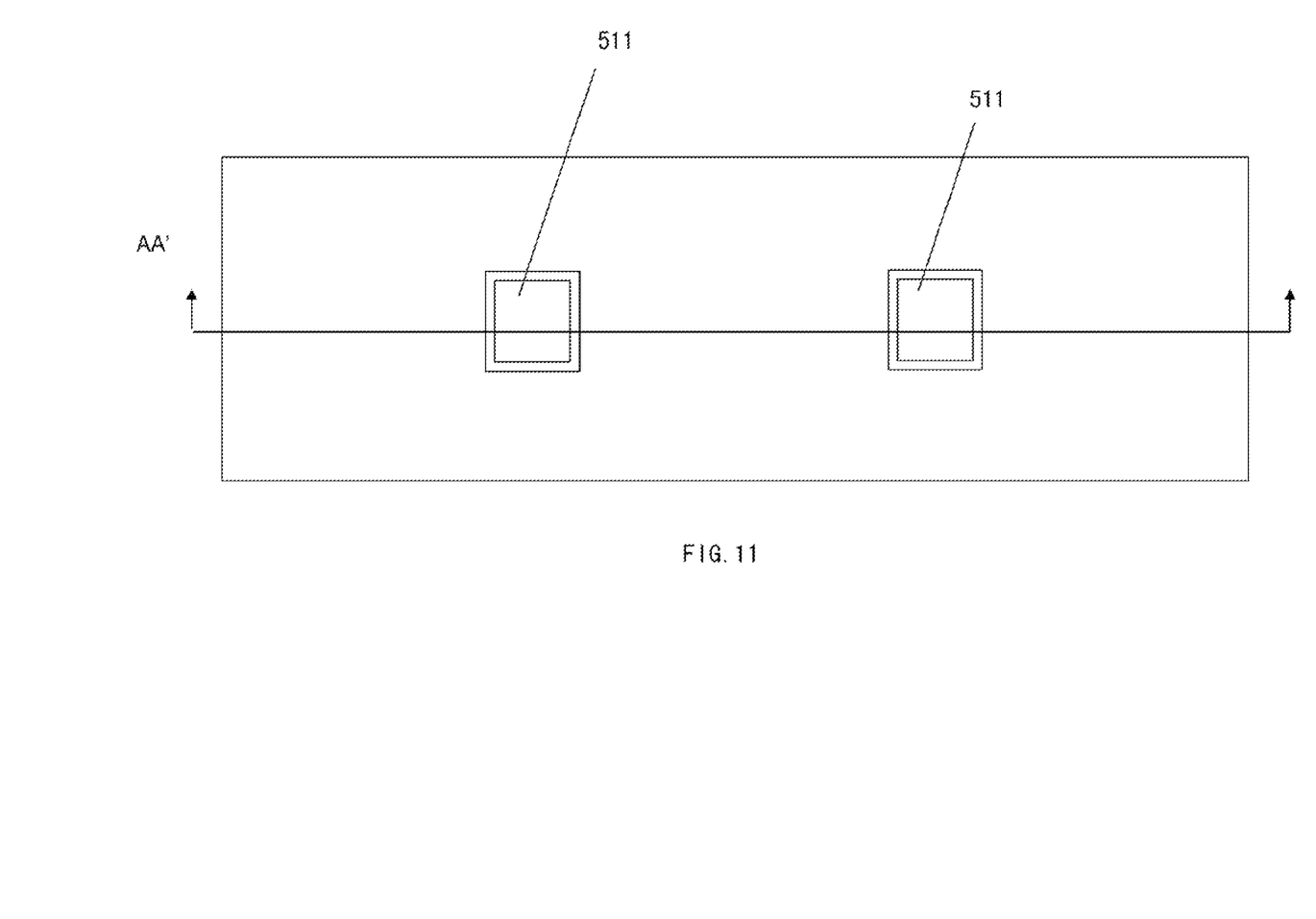
FIG. 11 shows a top view of the fifth step of the method for forming the semiconductor structure according to an exemplary embodiment of the invention.
Figure 12:
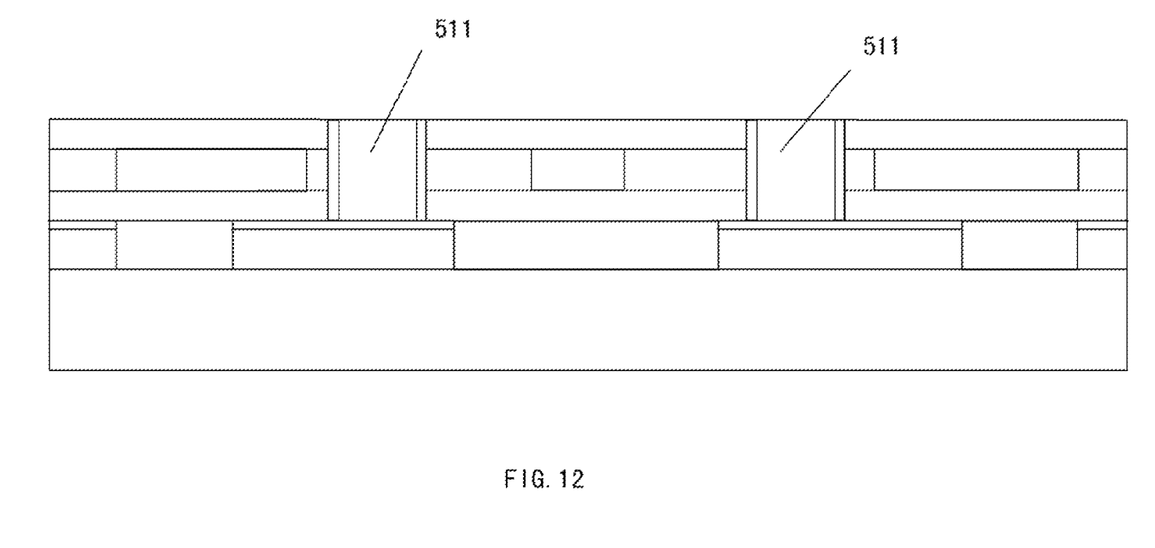
FIG. 12 shows the cross-section view of the semiconductor structure of FIG. 11 along line AA'.

FIG. 11 and FIG. 12 show the fifth step of the method for forming the semiconductor structure according to an exemplary embodiment of the invention. A semiconductor material 511 is deposited into the formed through hole 401.

FIG. 1 and FIG. 2 show the sixth step of the method for forming the semiconductor structure according to an exemplary embodiment of the invention. A conductor plug 613 serving as drain/source electrode is provided on the top of the through hole 401, a conductor plug 611 serving as source/drain electrode is provided to electrically contact the conductor layer 121, and a conductor plug 612 serving as gate electrode is provided to electrically contact the gate conductor layer 221. An insulating layer 621, of which the thickness may be adjusted according to different heights of the conductor plugs 611, 612 and 613, may be formed among the conductor plugs.

Optionally, the side wall layer may be formed of high-k materials in the fourth step (the high-k materials may be, for example, $HfO_2$, $Si_3N_4$, $Al_2O_3$, $TiO_2$, $ZnO$ or $CeO_2$, etc.), then the fifth step is performed, and laser annealing may be performed to increase the crystal size.

In one embodiment, the material for the dielectric layer 122 surrounding the conductor layer 121 and the dielectric layer 222 surrounding the gate conductor layer 221 preferably has high dielectric constant (e.g. $HfO_2$, $Si_3N_4$, $Al_2O_3$, $TiO_2$, $ZnO$ or $CeO_2$, etc.), and a metal silicide layer is formed on the top of the through hole 401 to obtain good electrical contact with the source/drain electrode.

To reduce sizes of devices (and increase the component density accordingly), and obtain different gate lengths, there is proposed a stacked semiconductor structure formed by the Damascene Process, which has the above semiconductor structure as the basic structure. Since the stacked structure is formed by stacking multiple layers of the semiconductor structure according to an exemplary embodiment of the invention, the method for forming the stacked semiconductor structure will be described summarily hereinafter.

In one embodiment, after performing steps of forming the semiconductor structure according to an aspect of the invention, a second substrate layer is formed on the formed semiconductor structure, and the steps of forming the semiconductor structure according to an aspect of the invention are performed again. Multiple layers of semiconductor structures can be obtained by continuing the stacking according to above steps. In two neighboring layers of semiconductor structures, the conductor plug provided on the top of the through hole in the lower semiconductor structure electrically contacts the conductor layer of the upper semiconductor structure, and thus two or multiple layers of stacked semiconductor structures as shown in FIG. 13 can be obtained. Since three-dimensional stacking of vertical field effect transistors is achieved, sizes of semiconductor devices can be reduced effectively (and the component density is increased accordingly), and vertical field effect transistors with different gate lengths can be obtained.

It should be noted that although only two-layers of stacked semiconductor structures are shown in FIG. 13, the invention is not limited thereto. According to requirements, those skilled in the art can select the number of the layers to be stacked, and suitable conductor plugs to obtain vertical field effect transistors with different gate lengths.

While the exemplary embodiments of the invention have been described in detail with reference to the drawings, such a description is to be considered illustrative or exemplary rather than restrictive. The invention is not limited to the disclosed embodiments. Various embodiments described in the above and the claims may also be combined. Other variations to the disclosed embodiments can be understood and effected by those skilled in the art in practicing the claimed invention, from a study of the drawings, the disclosure, and the appended claims, which variations also fall within the protective scope of the invention.

In the claims, the word "comprising" does not exclude the presence of other elements or steps, and "a" or "an" does not exclude a plurality. The mere fact that certain measures are recited in mutually different dependent claims does not indicate that a combination of these measures cannot be used to advantage.

We claim:

1. A stacked semiconductor structure, wherein the stacked semiconductor structure comprises at least two stacked layers of semiconductor structures, each of the semiconductor structures comprising:
    a substrate, a conductor layer, and a dielectric layer surrounding the conductor layer on the substrate;
    a first insulating layer covering both of the conductor layer and the dielectric layer;
    a gate conductor layer formed on the first insulating layer, and a dielectric layer surrounding the gate conductor layer; and
    a second insulating layer covering both of the gate conductor layer and the dielectric layer surrounding the gate conductor layer;
    wherein a through hole filled with a semiconductor material penetrates through the gate conductor layer perpendicularly, the bottom of the through hole stops on the conductor layer, and a first conductor plug serving as a drain/source electrode is provided on the top of the through hole; and
    a second conductor plug serving as a source/drain electrode electrically contacts the conductor layer, and a third conductor plug serving as a gate electrode electrically contacts the gate conductor layer;
    wherein the second conductor plug serving as a source/drain electrode and provided on the top of the through hole in the lower semiconductor structure electrically contacts the conductor layer of the upper semiconductor structure in two neighborin layers of the semiconductor structures, and other conductor plugs extend upward to the top of the stacked semiconductor structure in mutually different positions.

2. The semiconductor structure as claimed in claim 1, wherein the conductor layer is a metal layer, or the conductor layer comprises a metal layer and a metal silicide layer formed on the metal layer.

3. The semiconductor structure as claimed in claim 2, wherein the metal layer is made of tungsten, germanium, nickel, titanium or cobalt.

4. The semiconductor structure as claimed in claim 1, wherein the materials for the dielectric layer surrounding the conductor layer are high-k materials.

5. The semiconductor structure as claimed in claim 1, wherein the material for the first and second insulating layers SiO2.

6. The semiconductor structure as claimed in claim 1, wherein the material for the gate conductor layer is tungsten, germanium, nickel, titanium or cobalt.

7. The semiconductor structure as claimed in claim 1, wherein the materials for the first, second and third conductor plugs is tungsten, germanium, nickel, titanium or cobalt.

8. The semiconductor structure as claimed in claim 1, wherein the side wall layer of the through hole is made of high-k materials.

9. The semiconductor structure as claimed in claim 8, wherein the high-k materials comprises HfO2, Si3N4, Al2O3, TiO2, ZnO or CeO2.

10. The semiconductor structure as claimed in claim 1, wherein the semiconductor material filled in the through hole is P-type polysilicon or N-type polysilicon.

11. The semiconductor structure as claimed in claim 1, wherein a metal silicide layer is formed on the top of the through hole.

* * * * *